(12) United States Patent
Wang et al.

(10) Patent No.: US 10,978,403 B2
(45) Date of Patent: Apr. 13, 2021

(54) PACKAGE STRUCTURE AND METHOD FOR FABRICATING THE SAME

(71) Applicant: DELTA ELECTRONICS, INC., Taoyuan (TW)

(72) Inventors: Liang-Cheng Wang, Taoyuan (TW); Shiau-Shi Lin, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 16/262,421

(22) Filed: Jan. 30, 2019

(65) Prior Publication Data
US 2020/0243453 A1 Jul. 30, 2020

(51) Int. Cl.
| | | |
|---|---|---|
| *H01L 23/538* | (2006.01) | |
| *H01L 21/48* | (2006.01) | |
| *H01L 21/56* | (2006.01) | |
| *H01L 23/31* | (2006.01) | |
| *H01L 23/00* | (2006.01) | |
| *H01L 49/02* | (2006.01) | |

(52) U.S. Cl.
CPC ...... *H01L 23/5389* (2013.01); *H01L 21/4853* (2013.01); *H01L 21/4857* (2013.01); *H01L 21/565* (2013.01); *H01L 23/3121* (2013.01); *H01L 23/5383* (2013.01); *H01L 23/5386* (2013.01); *H01L 24/19* (2013.01); *H01L 24/20* (2013.01); *H01L 28/40* (2013.01); *H01L 2224/214* (2013.01); *H01L 2924/1033* (2013.01); *H01L 2924/1304* (2013.01); *H01L 2924/1426* (2013.01); *H01L 2924/19041* (2013.01); *H01L 2924/19105* (2013.01)

(58) Field of Classification Search
CPC .......... H01L 23/5389; H01L 23/3121; H01L 23/5383; H01L 23/5386; H01L 21/4853; H01L 21/4857; H01L 21/565; H01L 24/19; H01L 24/20
See application file for complete search history.

(56) References Cited

U.S. PATENT DOCUMENTS

| | | | |
|---|---|---|---|
| 6,239,459 B1 * | 5/2001 | Al-Shareef | H01L 28/60 257/295 |
| 6,611,419 B1 | 8/2003 | Chakravorty | |
| 6,911,371 B2 * | 6/2005 | Agarwal | H01L 21/76828 257/E21.008 |
| 7,106,105 B2 | 9/2006 | Bryson | |
| 8,652,920 B2 | 2/2014 | Prymak et al. | |
| 8,704,454 B2 | 4/2014 | Hopper et al. | |
| 9,681,536 B1 | 6/2017 | Wang et al. | |

(Continued)

FOREIGN PATENT DOCUMENTS

| | | |
|---|---|---|
| CN | 205140976 | 4/2016 |
| TW | I445437 | 7/2014 |

(Continued)

*Primary Examiner* — Seahvosh Nikmanesh
(74) *Attorney, Agent, or Firm* — Hauptman Ham, LLP

(57) ABSTRACT

A package structure includes a substrate, a first capacitor, a System on Chip unit and a wiring layer. The first capacitor is provided on the substrate. The System on Chip unit is bonded with the first capacitor in a first dielectric layer. The wiring layer is configured to electrically couple the first capacitor and the System on Chip unit. The wiring layer is provided on the first dielectric layer through a second dielectric layer.

13 Claims, 11 Drawing Sheets

(56) References Cited

U.S. PATENT DOCUMENTS

| | | | |
|---|---|---|---|
| 9,704,796 B1 | 7/2017 | Gu et al. | |
| 9,906,221 B1 | 2/2018 | Yang | |
| 9,941,054 B2 | 4/2018 | Sankman et al. | |
| 2003/0232481 A1* | 12/2003 | Huang | H01L 28/55 438/396 |
| 2014/0021584 A1* | 1/2014 | Tu | H01L 27/10897 257/532 |
| 2016/0300797 A1 | 10/2016 | Shim et al. | |
| 2017/0125386 A1 | 5/2017 | Hsiao et al. | |

FOREIGN PATENT DOCUMENTS

| | | |
|---|---|---|
| TW | 201729388 | 8/2017 |
| TW | 201841270 | 11/2018 |
| TW | 201901864 | 1/2019 |
| TW | I648834 | 1/2019 |

\* cited by examiner

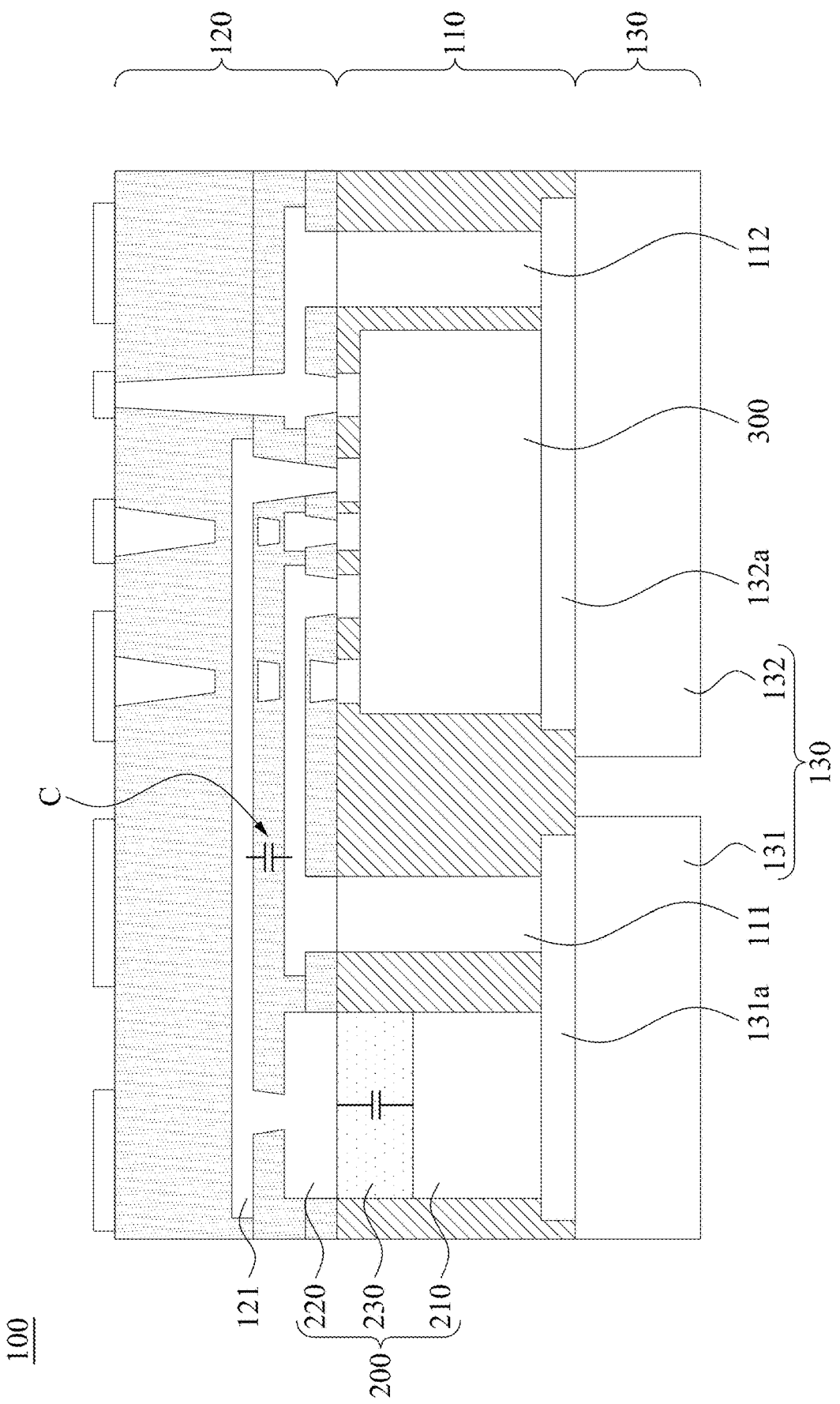

PACKAGE STRUCTURE AND METHOD FOR FABRICATING THE SAME

BACKGROUND

Technical Field

The present disclosure relates to a package structure, and more particularly, to package a capacitor and an integrated circuit.

Description of Related Art

Integrated circuit (IC) assemblies for complex electronic systems typically have a large number of interconnected IC chips. Integrated circuit chips are being fabricated with increasingly smaller sizes and higher circuit densities. In some circuits, it is necessary to use a large capacitor to implement some functions, such as boost or buck. However, limited by the structural limitations of the chip, the large capacitors cannot be deposed in the chip, and it caused a dilemma in designing circuits.

SUMMARY

One aspect of the present disclosure is a package structure. The package structure includes a substrate, a first capacitor, a System on Chip unit and a wiring layer. The first capacitor is provided on the substrate. The System on Chip unit is bonded with the first capacitor in a first dielectric layer. The wiring layer is configured to electrically couple the first capacitor and the System on Chip unit. The wiring layer is provided on the first dielectric layer through a second dielectric layer.

Another aspect of the present disclosure is a package structure. The package structure includes a first conductive element, an dielectric element and a second conductive element. The first conductive element is provided on a substrate. The dielectric element is provided on the first conductive element. The first conductive element, the dielectric element and a System on Chip unit are bonded through a first dielectric layer. The second conductive element is provided on the dielectric element, so that the first conductive element, the dielectric element and the second conductive element form a first capacitor.

Another aspect of the present disclosure is a method for fabricating a package structure. The method includes the following steps. Providing a first capacitor and a System on Chip unit on a substrate. Bonding the first capacitor and the System on Chip unit through a first dielectric medium to form a first dielectric layer. Forming a wiring layer on the first dielectric layer, so that the first capacitor is electrically coupled to the System on Chip unit through the wiring layer. Bonding the wiring layer to the first dielectric layer through a second dielectric medium to form a second dielectric layer on the first dielectric layer.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows:

FIG. 5A-FIG. 5G are schematic diagrams of the method in some embodiments of the present disclosure.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
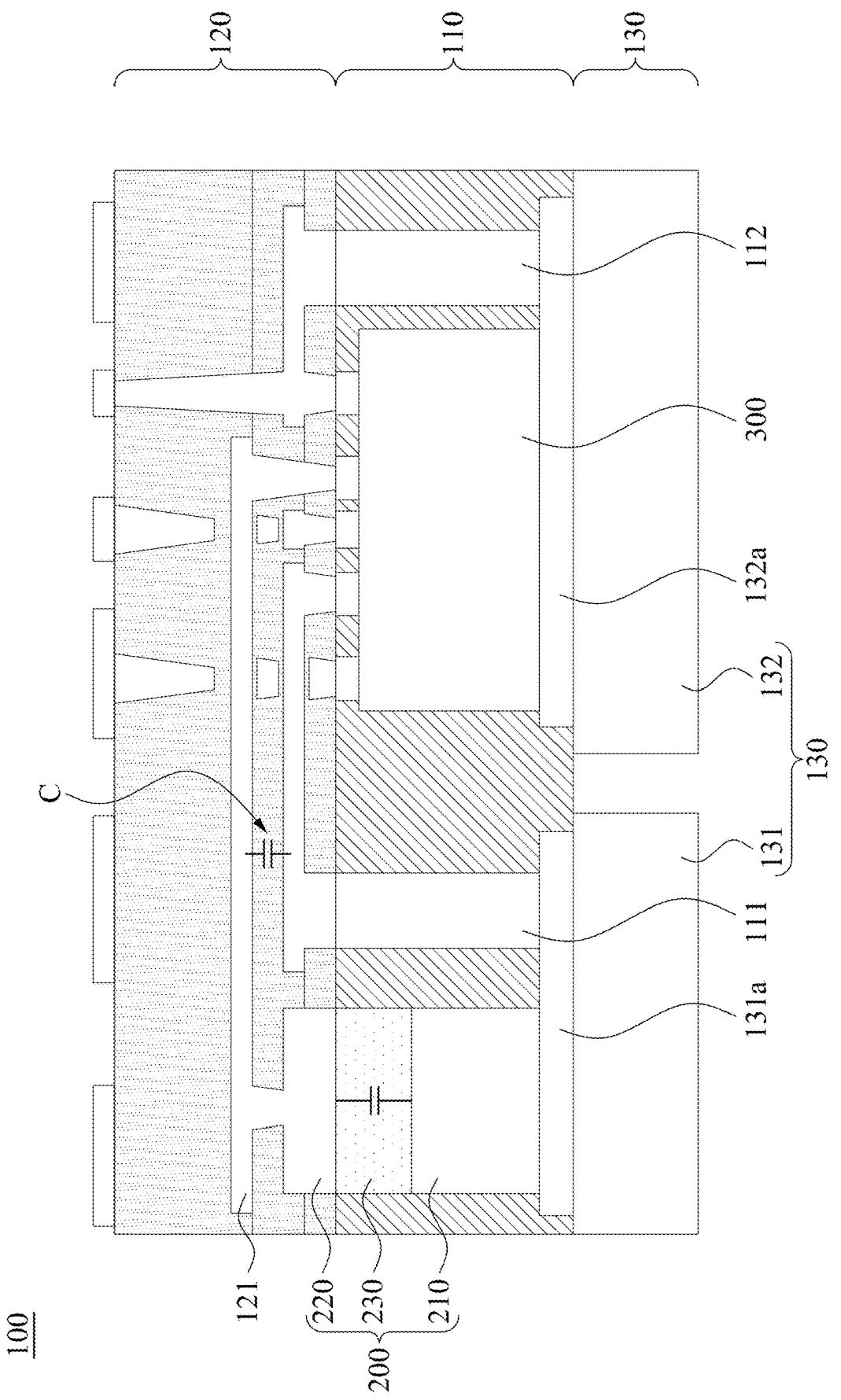
FIG. 1 is a schematic diagram of a package structure in some embodiments of the present disclosure.

Please referring to FIG. 1, which is a schematic diagram of a package structure in some embodiments of the present disclosure. The package structure 100 includes a substrate 130, a first capacitor 200, a System on Chip unit 300 and a wiring layer 121. In some embodiments, the substrate 130 includes a first carrier 131 and a second carrier 132 (e.g., a dielectric layer), and the first carrier 131 and the second carrier 132 respectively include a first conductive layer 131a and a second conductive layer 132a. The first carrier 131 and the second carrier 132 are insulated from each other. The first capacitor 200 is disposed on the first carrier 131 of the substrate 130. The System on Chip unit 300 is disposed on the second carrier 132 of the substrate 130.

In some embodiments, the first conductive element 210 is disposed on the first conductive layer 131a, which is disposed on the first carrier 131. The System on Chip unit 300 is disposed on the second conductive layer 132a, which is disposed on the second carrier 132. The material of the first carrier 131 and second carrier 132 may be or include stainless steel, copper (Cu), aluminum (Al), golden (Au), silver (Ag), tin (Sn), platinum (Pt), an alloy thereof, or the like. The first carrier 131 and the first conductive layer 131a may be the same or different materials. Similarly, the second carrier 132 and the second conductive layer 132a may be the same or different materials.

The package structure 100 further includes a first dielectric layer 110 and a second dielectric layer 120. The System on Chip unit 300 is bonded with the first capacitor 200 in the first dielectric layer 110. The wiring layer 121 is provided on the first dielectric layer 110 through the second dielectric layer 120. In some embodiments, the first dielectric layer 110 is formed by a molding process through a first dielectric medium so as to bond the first capacitor 200 and the System on Chip unit 300.

The wiring layer 121 is configured to electrically couple the first capacitor 200 and the System on Chip unit 300. In some embodiments, the material of the wiring layer 121 is metal and is made by laser drill and metal plating process. The details of the production method will be detailed later.

Figure 2B:
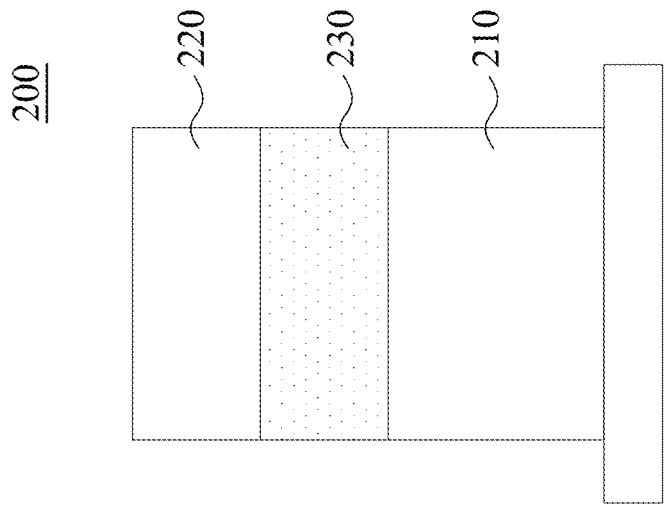
FIG. 2B is a schematic diagram of a first capacitor in some embodiments of the present disclosure.
Figure 2A:
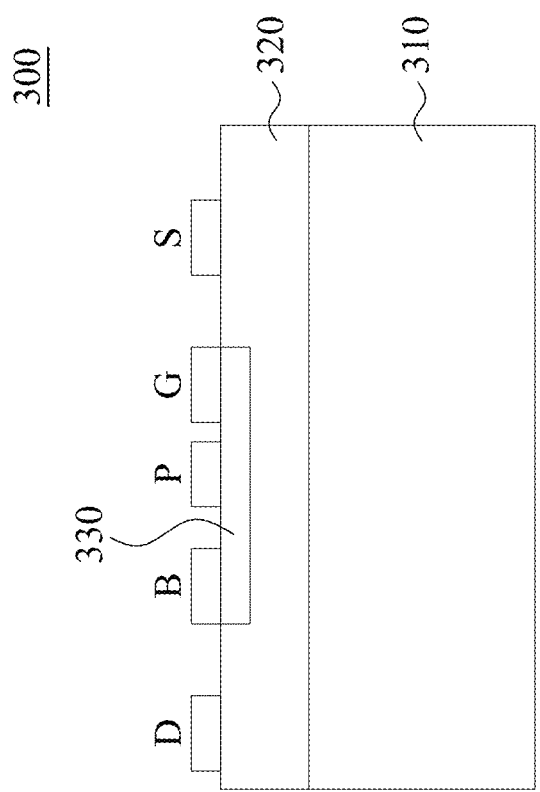
FIG. 2A is a schematic diagram of a System on Chip unit in some embodiments of the present disclosure.

Please referring to FIG. 1 and FIG. 2A, "the System on Chip unit" is an integrated circuit (also known as a "chip") that integrates all components of a computer or other electronic system. These components typically include a central processing unit (CPU), memory, input/output ports and secondary storage, which are all on a single substrate.

In some embodiments, the System on Chip unit 300 may include integrated circuits, such as logic integrated circuits, analog integrated circuits, mixed signal integrated circuits, power integrated circuits, or memory circuits; micro-electro mechanical systems (MEMS); opto-electronic devices; sensors, such as light sensors or fingerprint sensor; or the like. In some embodiments, the System on Chip unit 300 includes an active element (not shown) formed therein, such as a transistor, a metal oxide semiconductor field effect transistor (MOSFET), a metal insulator semiconductor FET (MISFET), a junction field effect transistor (JFET), an insulated gate bipolar transistor (IGBT), a combination thereof, or the like.

In some embodiments, the circuit in the System on Chip unit 300 requires a large capacitor. However, the area and volume of the large capacitor are too large so that it cannot be placed in the System on Chip unit 300. In the present disclosure, the first capacitor 200 is located in the first insulating layer 110 near to the System on Chip unit 300. Therefore, the present disclosure can configure a large capacitor without affecting the overall volume of the package structure 100.

Please referring to FIG. 1 and FIG. 2B, in some embodiments, the first capacitor 200 includes a first conductive element 210, an dielectric element 230 and a second conductive element 220. The first conductive element 210 and the second conductive element 220 can be a copper pillar. The first conductive element 210 is provided in the first dielectric layer 110. The first conductive element 210, the dielectric element 230 and the System on Chip unit 300 are all bonded through a first dielectric layer 110. The dielectric element 230 is provided on the first conductive element 210. The second conductive element 220 is provided on the dielectric element 230. The first conductive element 210, the dielectric element 230 and the second conductive element 220 form the first capacitor 200.

In order to adjust the capacitance value of the first capacitor 200, the material of the dielectric element 230 may be different from the material of the first dielectric layer 110 and the material of the second dielectric layer 120. For example, the material of the dielectric element 230 can be ceramic or mica, which is different from the material of the first dielectric medium. In some other embodiments, the first capacitor 200 does not include the dielectric element 230. The first conductive element 210 is spaced apart from the second conductive element 220 by a distance. The first dielectric medium of the first dielectric layer 110 can fill the space between the first conductive element 210 and the second conductive element 220. In other words, the material of the dielectric element 230 may be the same as the material of the first dielectric layer 110.

As shown in FIG. 1, in some embodiments, the first conductive element 210 and the dielectric element 230 are disposed in the first dielectric layer 110. The second conductive element 220 is disposed in the second dielectric layer 120. The second conductive element 220 and the wiring layer 121 are bonded through the second dielectric layer 120, and the second conductive element 220 is electrically coupled to the System on Chip unit 300 through the wiring layer 121. However, referring to FIG. 3, in other some embodiments, according to different production methods, the first conductive element 210, the dielectric element 230 and the second conductive element 220 may be all disposed in the first dielectric layer 110 and bonded through the first dielectric medium of the first dielectric layer 110. The second conductive element 220 is still electrically coupled to the System on Chip unit 300 through the wiring layer 121. The details of the production method will be detailed later.

Referring to FIG. 1 and FIG. 2A, In some embodiments, the System on Chip unit 300 includes a silicon substrate 310, a GaN material layer 320 and a driving circuit 330. The System on Chip unit 300 has at least three terminals at the upper surface of the System on Chip unit 300, which includes a source terminal S, a drain terminal D and a gate terminal G. In some embodiments, the System on Chip unit 300 further includes a bootstrap terminal B and a PWM terminal P, and the first capacitor 200 is a bootstrap capacitor of the driving circuit 330. The source terminal S, the drain terminal D and the gate terminal G respectively receive corresponding voltages to drive transistors in the driving circuit 330. The PWM terminal P is configured to receive a pules width modulation signal to control the switch element in the driving circuit 330. The bootstrap terminal B is electrically coupled to the negative terminal of the bootstrap capacitor of the driving circuit 330 (e.g., the first capacitor 200) so as to a bootstrap signal from the bootstrap capacitor of the driving circuit 330.

In some embodiments, the System on Chip unit 300 can be a GaN power transistor. The driving circuit 330 is a gate driving circuit. In some embodiments, the gate driving circuit includes a high-side transistor, a low-side transistor and a charge pump. For example, the gate driving circuit is discussed in more detail in U.S. Pat. No. 9,906,221 B1, filed on Dec. 30, 2016, entitled "DRIVING CIRCUIT OF A POWER CIRCUIT". The disclosure of which is hereby incorporated by reference in its entirety.

In the embodiment where the first capacitor 200 is a bootstrap capacitor of the driving circuit 330, the first capacitor 200 is electrically coupled to the gate terminal G and the bootstrap terminal B of the driving circuit 330. The first capacitor 200 is electrically coupled to the driving circuit 330 and is enabled according to the bootstrap signal.

As shown in FIG. 1, in some embodiments, the package structure 100 further includes a first conductor 111 disposed in the first dielectric layer 110. The first conductor 111 can be a Cu pillar. The first conductor 111 is disposed on the first carrier 131 through the first conductive layer 131a so as to electrically couple to a first side (e.g., bottom surface) of the first capacitor 200. The wiring layer 121 is electrically coupled to a second side (e.g., top surface) of the first capacitor 200. The wiring layer 121 is electrically coupled to the gate terminal G of the System on Chip unit 300, and the first conductor 111 is electrically coupled to the drain terminal D and the bootstrap terminal B of the System on Chip unit 300.

The package structure 100 further includes a second conductor 112. The second conductor 112 can be a Cu pillar. The second conductor 112 is disposed on the second carrier 132 through the second conductive layer 132a so as to electrically couple to a first side (e.g., bottom surface) of the System on Chip unit 300. In addition, the second conductor 112 also electrically couple to second side (e.g., top surface) of the first capacitor 200 so as to receive a source signal to the source terminal S.

Figure 4:
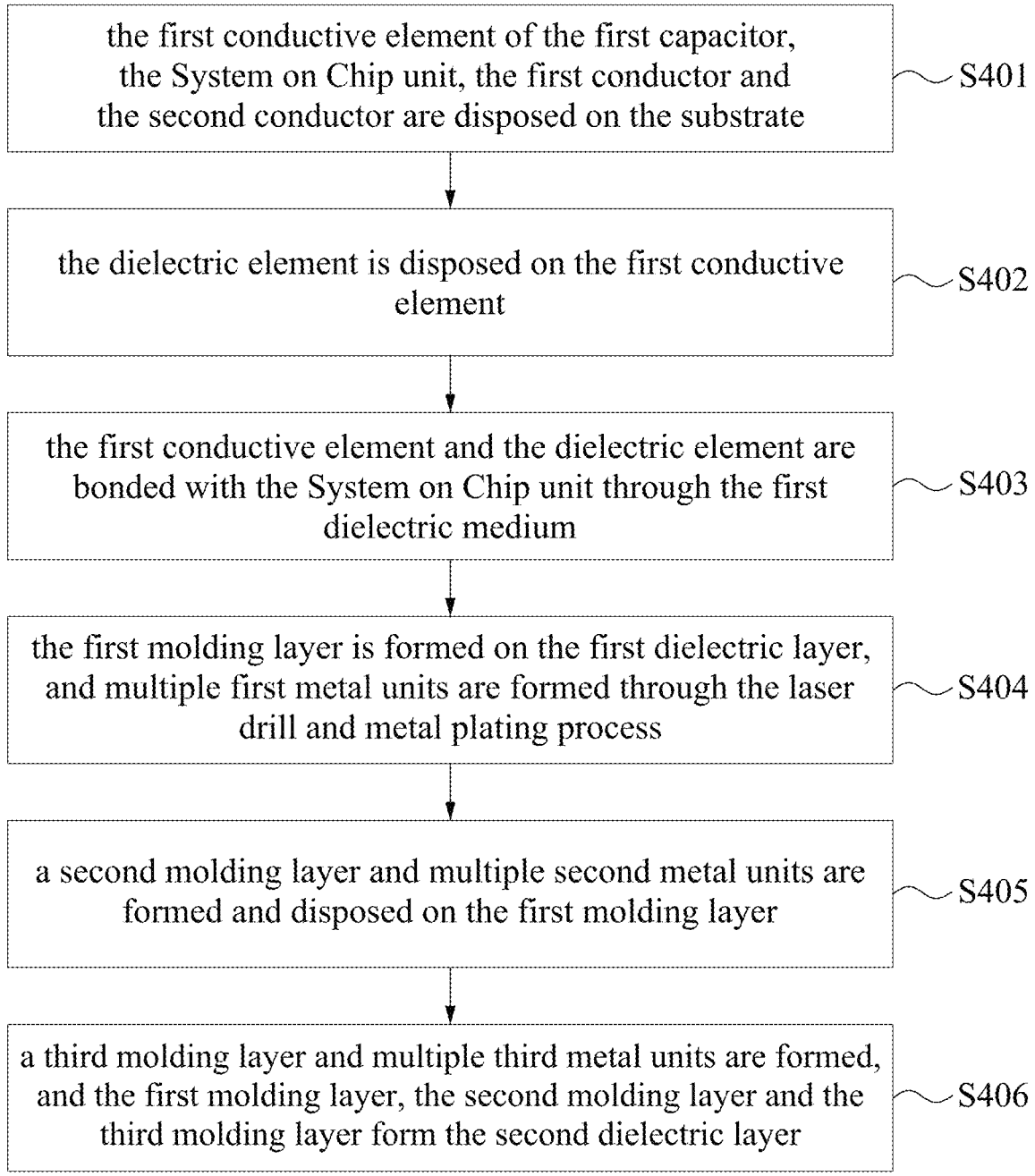
FIG. 4 is a flowchart illustrating a method for fabricating a package structure in some embodiments of the present disclosure.

FIG. 4 is a flowchart illustrating a method for fabricating the package structure 100 of FIG. 1 in some embodiments of the present disclosure. FIGS. 5A-5E are diagrams illustrating processes for fabricating the package structure 100 of FIG. 1 in some embodiments of the present disclosure. Referring to FIG. 1, FIG. 4 and FIGS. 5A-5B, the method includes the following steps S401-S406. In step S401, the first conductive element 210 of the first capacitor 200, a System on Chip unit 300, a first conductor 111, and a second conductor 112 are disposed on a substrate 130. In some embodiments, the first conductive element 210 of the first capacitor 200 is formed on the first carrier 131 with the first conductive layer 131*a* therebetween. The System on Chip unit 300 is disposed on the second carrier 132 with the second carrier 132*a* therebetween.

Figure 5A:
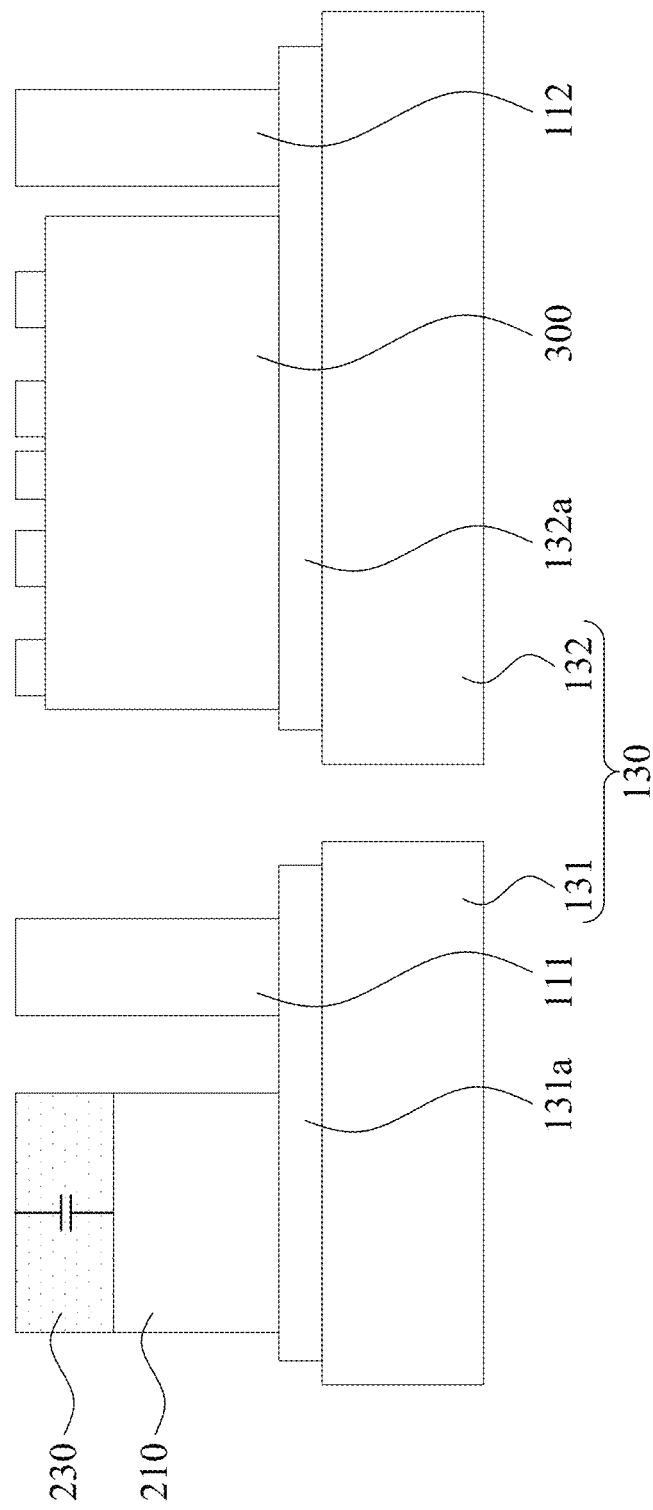
Figure 5B:
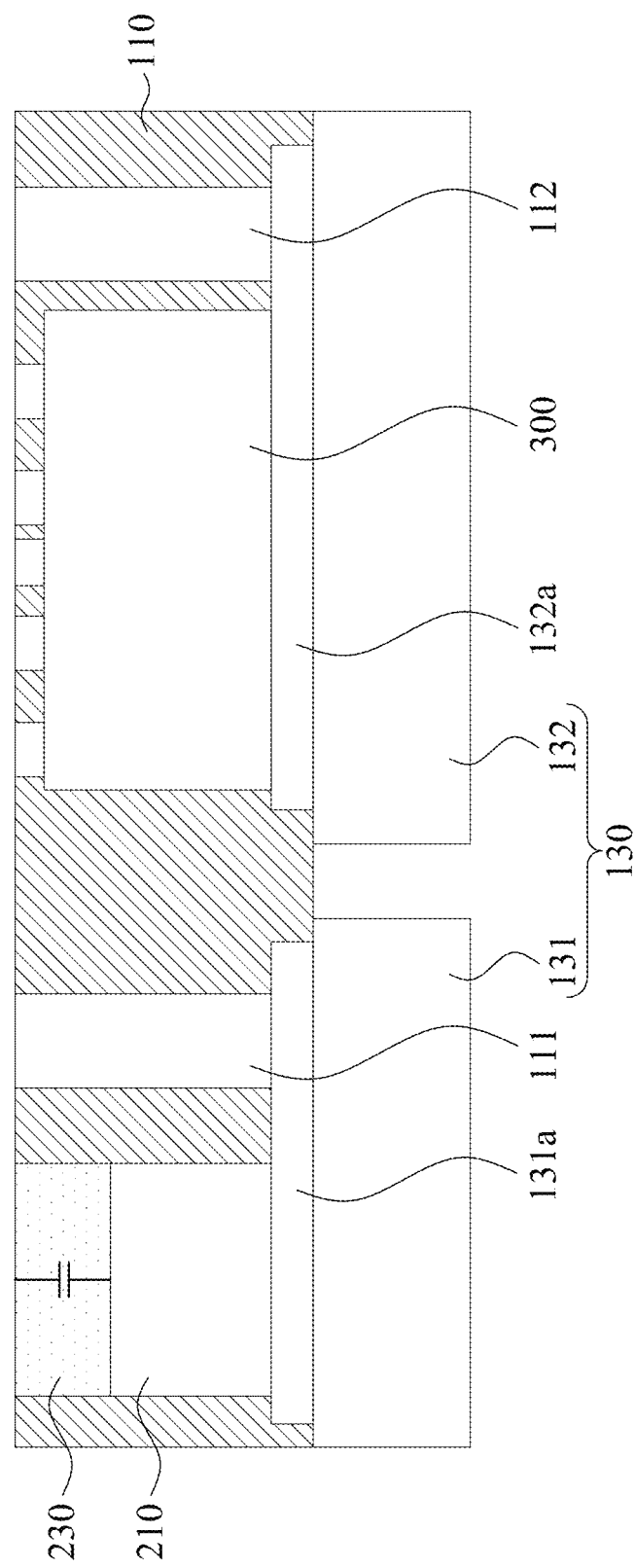

Referring to FIG. 5A-FIG. 5B, in step S402, an dielectric element 230 is formed on the first conductive element 210. In step S403, the first conductive element 210 and the dielectric element 230 of the first capacitor 200 is bonded with the System on Chip unit 300 through the first dielectric medium to form the first dielectric layer 110. In some embodiments, the material of the first dielectric medium may be Epoxy or Bismaleimide Triazine Resin.

Figure 5C:
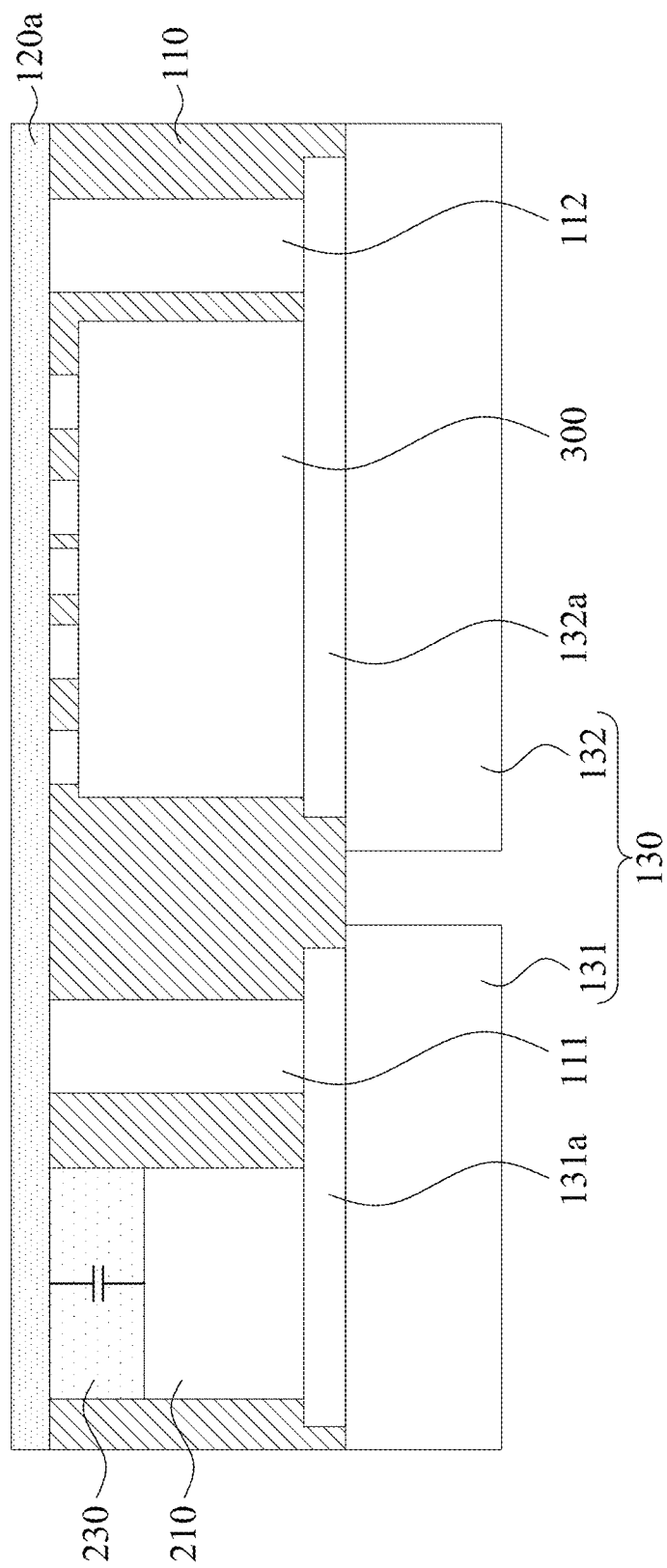
Figure 5D:
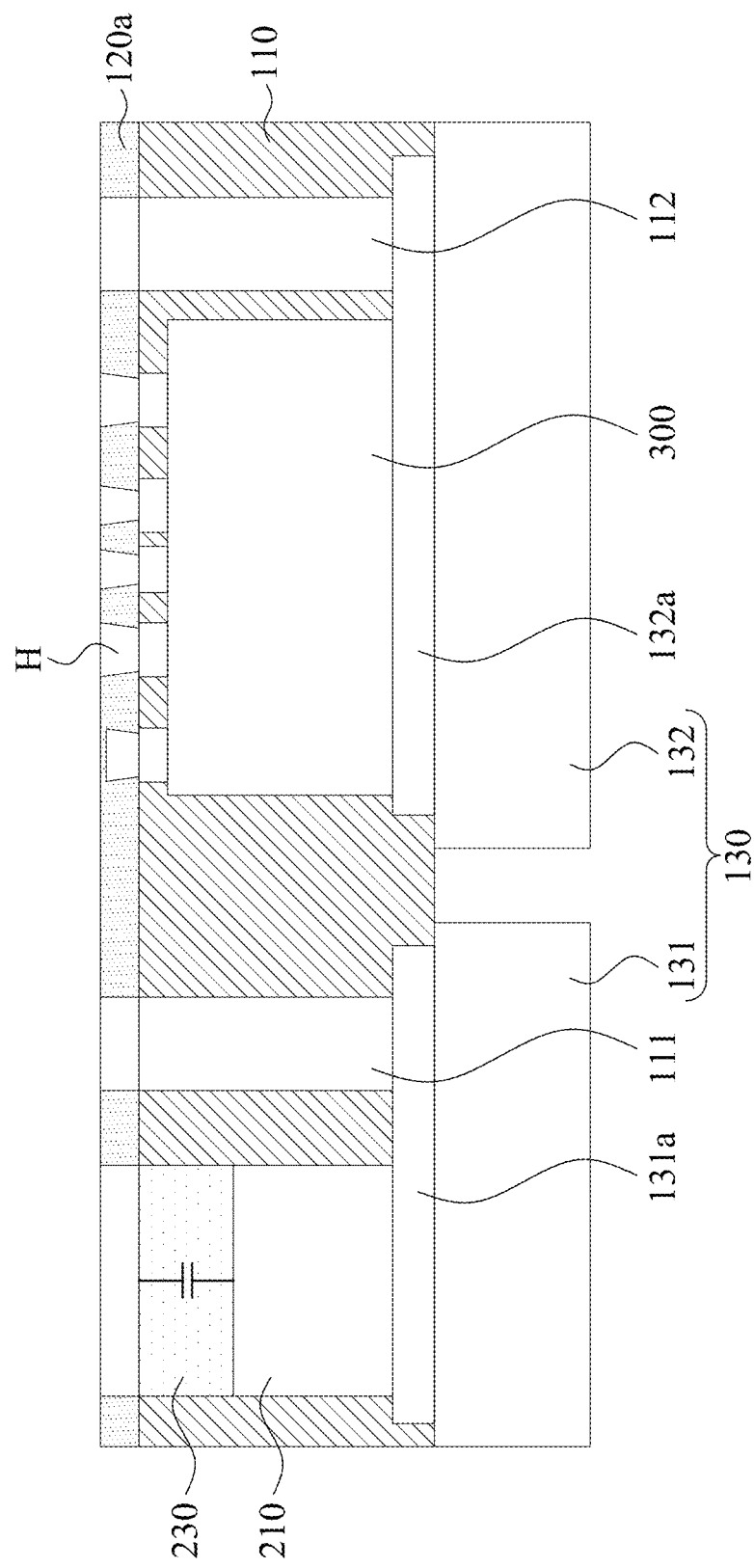
Figure 5E:
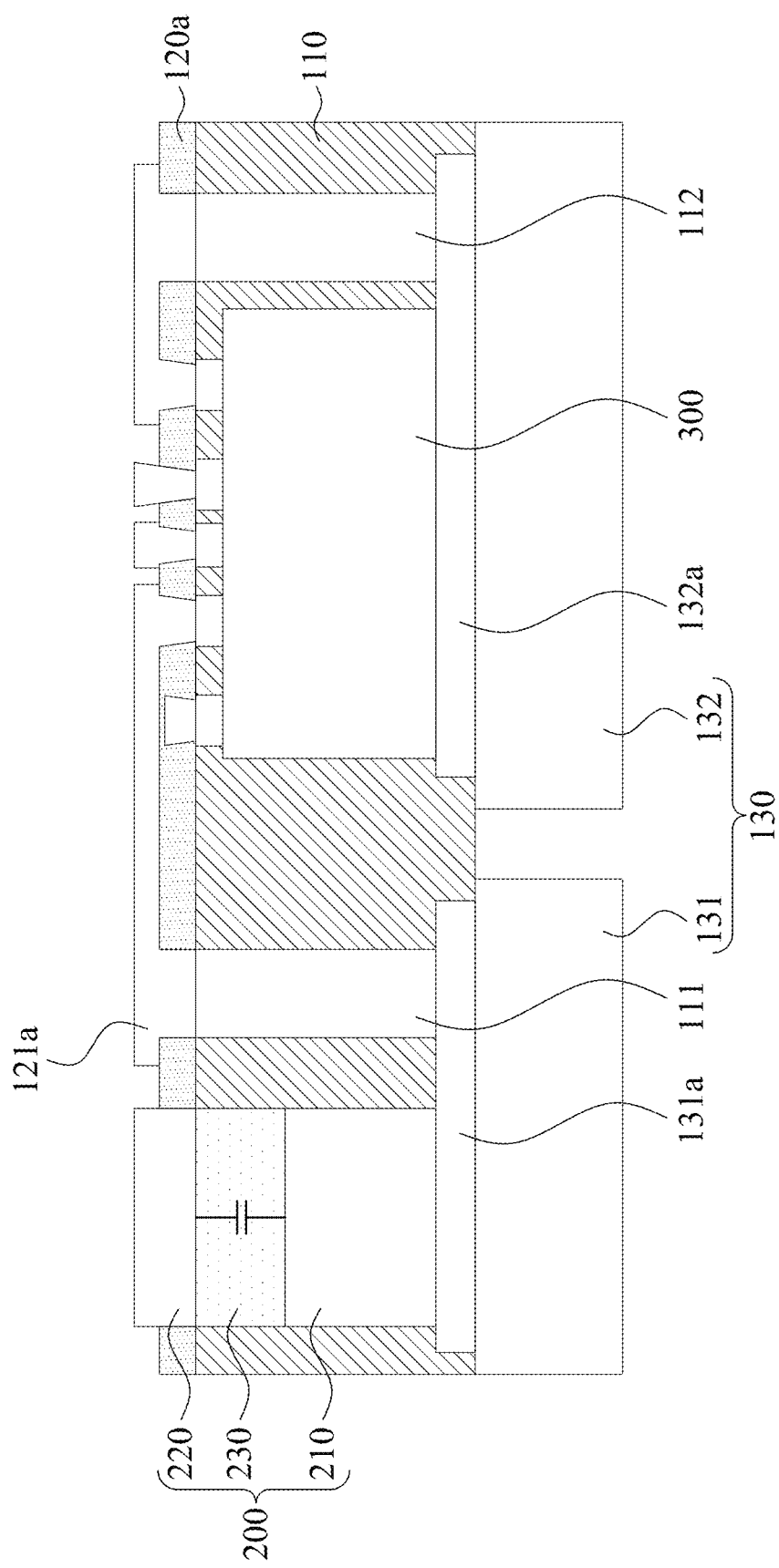

In step S404, referring to FIG. 5C-5E, the first molding layer 120*a* on the first dielectric layer 110 is formed by a molding process. Then, multiple first metal units 121*a* are formed by the laser drill and metal plating process. In some embodiments, as shown in FIG. 5C and FIG. 5D, after forming the first molding layer 120*a* by the molding process, etching the first molding layer 120*a* to form multiple holes H corresponding to the dielectric element 230, first conductor 111, the second conductor 112 and the System on Chip unit 300. Then, as shown in FIG. 5E, through the laser drill and metal plating process to the first molding layer 120*a*, forming multiple first metal units 121*a* on the first dielectric layer 110. In some embodiments, one of the first metal units 121*a* become the second conductive element 220. The first molding layer 120*a* on the first dielectric layer 110 is configured to fix the second conductive element 220 and the first metal units 121*a*.

Figure 5F:
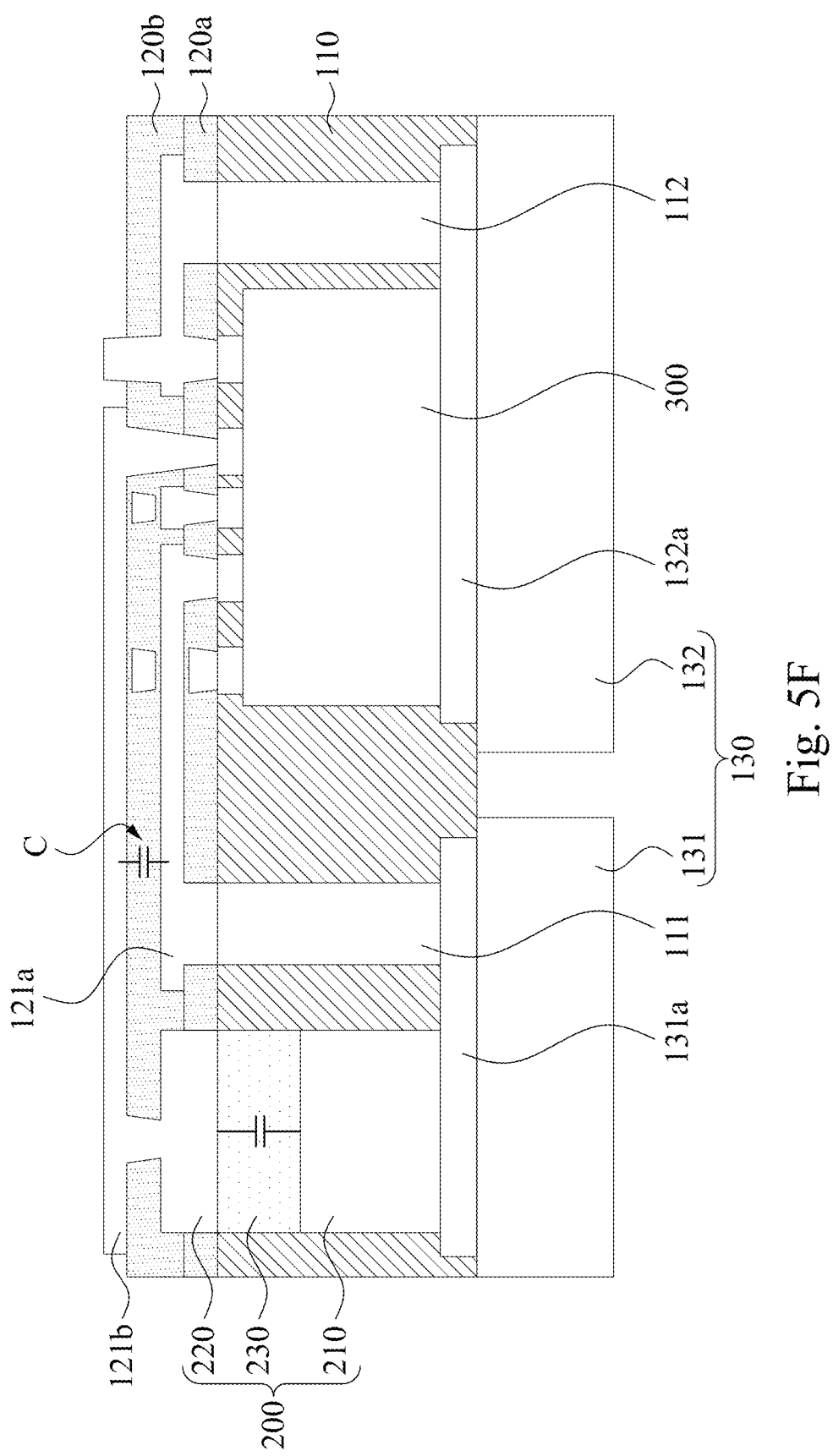

Referring to the FIG. 5F, in step S405, a second molding layer 120*b* and multiple second metal units 121*b* are formed and disposed on the first molding layer 120*a* with the same method as in step S404. The first metal units 121*a* and the second metal units 121*b* form the wiring layer 121, so that the first conductive element 210 of the first capacitor 200 is electrically coupled to the The bootstrap terminal B of the System on Chip unit 300 through the first conductor 111 and the first metal units 121*a*. The second conductive element 220 is electrically coupled to the gate terminal G through the second metal units 121*b*.

In step S406, referring to FIG. 1 and FIG. 5G, a third molding layer 120*c* and multiple third metal units 121*c* are formed and disposed on the second molding layer 120*b*. The first molding layer 120*a*, the second molding layer 120*b* and the third molding layer 120*c* form the second dielectric layer 120. In some embodiments, the first molding layer 120*a*, the second molding layer 120*b* and the third molding layer 120*c* all using the second dielectric medium. The second dielectric medium is configured to bond the wiring layer 121 and the second conductive element 220 to the first dielectric layer 110 to form the second dielectric layer 120. In some other embodiments, the first molding layer 120*a*, the second molding layer 120*b* and the third molding layer 120*c* can use the different dielectric medium.

In some embodiments, after forming the first metal units 121*a* and the second metal units 121*b*, a second capacitor C is formed in a gap of the wiring layer 121. Referring to FIG. 1 and FIG. 5G, the gap between one of the first metal units 121*a* and one of the second metal units 121*b* can form a second capacitor C. The second capacitor C is formed in the second dielectric layer 120 and is electrically coupled the first capacitor 200 in parallel so that the first capacitor 200 and the second capacitor C may be used to be a bootstrap capacitor of the driving circuit 330.

In the method of the present disclosure, it can directly dispose a first capacitor 200, which is already packaged as a package structure, on the substrate 130. That is, the first conductive element 210, the dielectric element 230 and the second conductive element 220 are first packaged into the first capacitor 200. Then, the first capacitor 200 placed on the substrate 130. in some other embodiments, the first conductive element 210 and the dielectric element 230 are first packaged together and be disposed on the substrate 130. Then, after forming the first dielectric layer 110, disposing the second the first conductive element 210, the dielectric element 230 and the second conductive element 220 are first packaged on the first dielectric layer 110.

Figure 3:
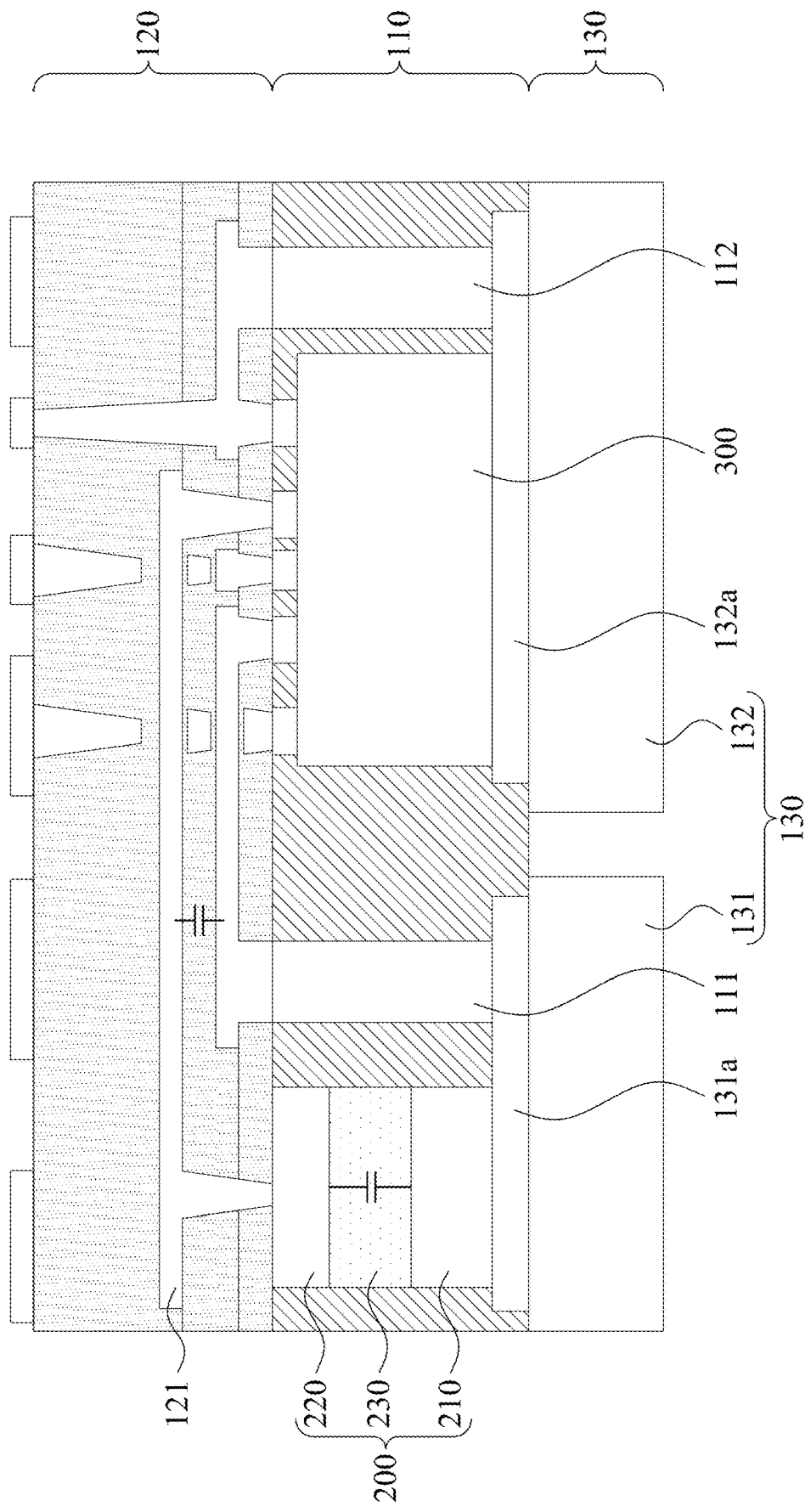
FIG. 3 is a schematic diagram of a package structure in some embodiments of the present disclosure.

In the embodiment shown in FIG. 5A-FIG. 5G, the second conductive element 220 is formed on the dielectric element 230 and disposed in the second dielectric layer 120. In some embodiments of other method, as shown in FIG. 3, after forming an dielectric element 230 on the first conductive element 210, the method is disposing the second conductive element 220 on the dielectric element 230. Then, bonding the first conductive element 210, the second conductive element 220 and the dielectric element 230 through the first dielectric medium. That is, the first conductive element 210, the second conductive element 220 and the dielectric element 230 are all deposed in the first dielectric layer 110.

In some embodiments, after the first conductive element 210 disposed on the substrate 130, the first dielectric medium fixes the first conductive element 210 and the System on Chip unit 300. In this embodiment, the first dielectric medium is used for the dielectric element. After forming the first dielectric layer 110, deposing the second conductive element 220 on the first dielectric layer 110. The first conductive element 210 is spaced apart from the second conductive element 220 by a distance. Accordingly, the first conductive element 210, the second conductive element 220 and the first dielectric medium between the first conductive element 210 and the second conductive element 220 forms the first capacitor 200.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A package structure, comprising:
   a substrate layer comprising a first carrier and a second carrier laterally separated from the first carrier;
   a first dielectric layer disposed over the substrate layer;
   a first capacitor at least partially disposed in the first dielectric layer, wherein the first capacitor is disposed over the first carrier at a first carrier-side of the first dielectric layer;

a System on Chip unit disposed in the first dielectric layer and over the second carrier at a second carrier-side of the first dielectric layer, wherein the System on Chip unit is separated from the first capacitor by a portion of the first dielectric layer between the System on Chip unit and the first capacitor;

a second dielectric layer disposed over the first dielectric layer; and a wiring layer disposed in the second dielectric layer and electrically coupling the first capacitor and the System on Chip unit, wherein the wiring layer extends over the first capacitor, wherein the wiring layer further extends over the portion of the first dielectric layer between the System on Chip unit and the first capacitor, and wherein the wiring layer further extends over the System on Chip unit.

2. The package structure of claim 1, wherein the first capacitor comprises:
a first conductive element formed in the first dielectric layer;
an dielectric element formed on the first conductive element; and
a second conductive element formed on the dielectric element.

3. The package structure of claim 2, wherein a material of the dielectric element is different from a material of the first dielectric layer and a material of the second dielectric layer.

4. The package structure of claim 1, wherein the first capacitor comprises:
a first conductive element disposed in the first dielectric layer; and
a second conductive element spaced apart from the first conductive element by a distance.

5. The package structure of claim 1, further comprising:
a first conductor disposed in the first dielectric layer, the first capacitor electrically coupled to the System on Chip unit through the first conductor and the wiring layer.

6. The package structure of claim 1, wherein the System on Chip unit comprises a gate driving circuit, and the first capacitor is a bootstrap capacitor of the gate driving circuit.

7. The package structure of claim 1, wherein the System on Chip unit comprises a GaN power transistor.

8. The package structure of claim 1, further comprising:
a second capacitor formed in the second dielectric layer and electrically coupled the first capacitor in parallel.

9. A package structure, comprising:
a first dielectric layer disposed over a first carrier and a second carrier laterally separated from the first carrier;
a first conductive element disposed in the first dielectric layer and over the first carrier at a first carrier-side of a first dielectric layer;
a System on Chip unit disposed in the first dielectric layer and over the second carrier at a second carrier-side of the first dielectric layer, wherein the System on Chip unit is separated from the first conductive element by a portion of the first dielectric layer between the System on Chip unit and the first conductive element;
a dielectric element disposed in the first dielectric layer and over the first conductive element at the first carrier-side of the first dielectric layer, wherein the System on Chip unit is separated from the dielectric element by a portion of the first dielectric layer between the System on Chip unit and the dielectric element; and
a second conductive element disposed over the dielectric element, wherein the first conductive element, the dielectric element and the second conductive element form a first capacitor, and wherein the first capacitor and the System on Chip unit are electrically coupled by a wiring layer extending over the first dielectric layer.

10. The package structure of claim 9, wherein the first conductive element, the second conductive element, the dielectric element and the System on Chip unit are bonded through the first dielectric layer, and the second conductive element is electrically coupled to the System on Chip unit through the wiring layer.

11. The package structure of claim 9, wherein the second conductive element and the wiring layer are bonded through a second dielectric layer, and the second conductive element is electrically coupled to the System on Chip unit through the wiring layer.

12. The package structure of claim 9, wherein a material of the dielectric element comprises ceramic or mica.

13. The package structure of claim 9, wherein a material of the dielectric element is the same as a material of the first dielectric layer.

* * * * *